United States Patent
Yang et al.

(10) Patent No.: US 9,911,671 B2
(45) Date of Patent: Mar. 6, 2018

(54) ENCAPSULATION SYSTEM AND METHOD HAVING VARIABLE OUTPUT FOR HEATING ENCAPSULANT

(71) Applicants: Boe Technology Group Co., Ltd., Beijing (CN); Beijing Boe Optoelectronics Technology Co., Ltd., Beijing (CN)

(72) Inventors: Jiuxia Yang, Beijing (CN); Feng Bai, Beijing (CN); Liang Zhang, Beijing (CN); Xu Chen, Beijing (CN); Ang Xiao, Beijing (CN)

(73) Assignees: BOE TECHNOLOGY GROUP CO., LTD., Beijing (CN); BEIJING BOE OPTOTECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/777,596

(22) PCT Filed: Mar. 17, 2015

(86) PCT No.: PCT/CN2015/074361
§ 371 (c)(1),
(2) Date: Sep. 16, 2015

(87) PCT Pub. No.: WO2016/061988
PCT Pub. Date: Apr. 28, 2016

(65) Prior Publication Data
US 2016/0300769 A1 Oct. 13, 2016

(30) Foreign Application Priority Data

Oct. 23, 2014 (CN) .......................... 2014 1 0571923

(51) Int. Cl.
*H01L 51/56* (2006.01)
*H01L 51/52* (2006.01)
(Continued)

(52) U.S. Cl.
CPC ............ *H01L 22/26* (2013.01); *B23K 26/206* (2013.01); *G01B 11/0616* (2013.01);
(Continued)

(58) Field of Classification Search
CPC ................. H01L 22/20–22/34; H01L 51/5246
See application file for complete search history.

(56) References Cited

U.S. PATENT DOCUMENTS

2009/0086325 A1* 4/2009 Liu ..................... H01L 51/5246
359/599
2010/0118912 A1* 5/2010 Lai ......................... G01N 25/72
374/5

(Continued)

FOREIGN PATENT DOCUMENTS

| CN | 101842916 | 9/2010 |
|---|---|---|
| CN | 101842918 | 9/2010 |

(Continued)

OTHER PUBLICATIONS

Office action from Chinese application No. 201410571923.2 dated May 4, 2016.

(Continued)

*Primary Examiner* — Binu Thomas
(74) *Attorney, Agent, or Firm* — Calfee, Halter & Griswold LLP (57) ABSTRACT

The present disclosure discloses an encapsulation system and an encapsulation method, the encapsulation system including a thickness detection unit, an output control unit and an energy output unit, the thickness detection unit being connected with the output control unit, and the output control unit being connected with the energy output unit. The thickness detection unit is configured to detect a thickness of an encapsulant at a to-be-heated location in a component to be encapsulated and generate corresponding (Continued)

thickness information. The output control unit is configured to generate corresponding output control information depending on the thickness information. The energy output unit is configured to output, depending on the output control information, to the encapsulant at the to-be-heated location energy for heating the encapsulant.

15 Claims, 6 Drawing Sheets (51) Int. Cl.
G01B 21/02 (2006.01)
H01L 21/66 (2006.01)
B23K 26/20 (2014.01)
G01B 11/06 (2006.01)
H01L 27/32 (2006.01)

(52) U.S. Cl.
CPC ............. *G01B 21/02* (2013.01); *H01L 27/32* (2013.01); *H01L 51/5246* (2013.01); *H01L 51/5253* (2013.01); *H01L 51/56* (2013.01); *H01L 22/10* (2013.01); *H01L 22/12* (2013.01)

(56) References Cited

U.S. PATENT DOCUMENTS

| 2013/0095582 A1* | 4/2013 | Miyairi ............... H01L 51/5246 438/26 |
| 2013/0260016 A1 | 10/2013 | Georgeson et al. |
| 2015/0276621 A1* | 10/2015 | Zhang ................ G01N 21/9501 250/341.8 |

FOREIGN PATENT DOCUMENTS

| CN | 102865939 | 1/2013 |
| CN | 103383468 | 11/2013 |
| CN | 103474587 | 12/2013 |
| CN | 103474588 | 12/2013 |
| CN | 103537801 | 1/2014 |
| CN | 103537801 A * | 1/2014 |
| CN | 203566078 | 4/2014 |
| CN | 104362262 | 2/2015 |
| JP | H08316258 | 11/1996 |
| JP | H11177227 | 7/1999 |
| KR | 20120111247 | 10/2012 |
| WO | 2009/108319 | 9/2009 |

OTHER PUBLICATIONS

Office action from Chinese Application No. 201410571923.2 dated Nov. 10, 2016.
International Search Report and Written Opinion from PCT/CN15/074361 dated Jul. 20, 2015.

* cited by examiner

ENCAPSULATION SYSTEM AND METHOD HAVING VARIABLE OUTPUT FOR HEATING ENCAPSULANT

RELATED APPLICATION

The present application claims the benefit of Chinese Patent Application No. 201410571923.2 filed with the Patent Office of China on Oct. 23, 2014, the entire disclosure of which is incorporated herein by reference.

FIELD OF THE DISCLOSURE

The present disclosure relates to the field of display technology, and in particular to an encapsulation system and an encapsulation method.

BACKGROUND OF THE DISCLOSURE

As a new type of display device, an organic light-emitting display device (OLED) boasts an excellent color saturation and a wide visual angle. However, since organic light-emitting materials in the OLED are sensitive to various ambient factors (such as moisture and oxygen), it is necessary to isolate the organic light-emitting materials gas-tightly from the ambient environment, and the organic light-emitting materials are generally isolated gas-tightly from the ambient environment by encapsulation.

In the prior art, the encapsulation of an organic light-emitting material is carried out as follows: firstly, forming one or more layers of the organic light-emitting material on a first substrate (comprising thin film transistors and electrodes) while forming a closed path on a second substrate with frit in the form of a paste (the area enclosed by the closed path is sufficient to accommodate the organic light-emitting material formed on the first substrate); then heating the second substrate with frit provided thereon in an oven to sinter it (also called "pre-sintering") such that the frit is integrated with the second substrate; further then cell-aligning the first substrate with the second substrate to form a glass component, where the frit is located between the two substrates and the organic light-emitting material is located within the area enclosed by the closed path formed by the frit; finally, heating the frit in the glass component to make it soft and then cool it, thereby achieving sealing of the organic light-emitting material by using the first substrate, the second substrate and the frit.

At present, requirements for water-proof and oxygen-proof parameters of an organic light-emitting display device include: the permeability to oxygen is required to be smaller than 10-3 cc/m2/day, and the permeability to water is required to be smaller than 10-6 g/m2/day. However, a product manufactured according to a current encapsulation process can hardly satisfy the above parameter requirements. The reason lies in that, in the current encapsulation procedure, after process parameters of the encapsulation process have been set, the encapsulation will be carried out in light of the preset process parameters of the encapsulation procedure despite the actual state of the frit. In practical production, since the frit has different thicknesses at different parts of the substrate (the thickness of the frit in a marginal area is greater than that in a central area), if it is processed in light of the preset process parameters of the encapsulation procedure, part of the frit will not sufficiently melt, which may give rise to bubbles in the frit when the frit is softened and thereby influence the sealing of the product.

Moreover, there may be a certain deviation of location of the frit when it is coated, and since the related process parameters have been preset during the heating and melting process, it will be inevitable that the frit in the deviation location cannot be heated and melted, resulting in degraded sealing of the product.

SUMMARY

The present disclosure provides an encapsulation system and an encapsulation method that are capable of effectively solving the technical problem of poor actual sealing effects due to fixed process parameters in the prior art.

To achieve this, the present disclosure provides an encapsulation system comprising a thickness detection unit, an output control unit and an energy output unit, the thickness detection unit being connected with the output control unit, and the output control unit being connected with the energy output unit.

The thickness detection unit is configured to detect a thickness of an encapsulant at a to-be-heated location in a component to be encapsulated, and generate corresponding thickness information.

The output control unit is configured to generate corresponding output control information depending on the thickness information.

The energy output unit is configured to output, depending on the output control information, to the encapsulant at the to-be-heated location energy for heating and melting the encapsulant so as to seal the component to be encapsulated.

Optionally, the encapsulation system further comprises a location detection unit and an adjustment unit, the location detection unit being connected with the adjustment unit, and the adjustment unit being connected with both the thickness detection unit and the energy output unit.

The location detection unit is configured to detect an actual location of the encapsulant at the to-be-heated location in the component to be encapsulated and generate corresponding location information.

The adjustment unit is configured to adjust, depending on the location information, a detection location of the thickness detection unit and an energy output location of the energy output unit.

Alternatively, the output control information comprises first output information and second output information, and the output control unit comprises a groove judgment module, a depth judgment module and a first output control module, the groove judgment module being connected with the thickness detection unit, the depth judgment module and the first output control module, the depth judgment module being connected with the first output control module, and the first output control module being connected with the energy output unit, wherein:

the groove judgment module is configured to judge whether a groove is existent in a surface of the encapsulant depending on the thickness information;

if the groove is judged to be existent in the surface of the encapsulant, the depth judgment module judges whether the depth of the groove is greater than a predetermined value, and if the depth of the groove is judged to be greater than the predetermined value, the first output control module transmits the first output information to the energy output unit, and if the depth of the groove is judged to be smaller than or equal to the predetermined value, the first output control module transmits the second output information to the energy output unit;

if the groove is judged to be non-existent in the surface of the encapsulant, the first output control module transmits the second output information to the energy output unit;

the energy output unit outputs to the encapsulant at the to-be-heated location preset energy in a hump-shape distribution depending on the first output information; and the energy output unit outputs to the encapsulant at the to-be-heated location preset energy in a Gaussian distribution depending on the second output information.

Alternatively, the output control unit comprises a contour generation module and a second output control module, the contour generation module being connected with both the thickness detection unit and the second output control module, and the second output control module being connected with the energy output unit, wherein:

the contour generation module is configured to generate, depending on the thickness information, surface contour information of the encapsulant at the to-be-heated location;

the second output control module is configured to generate the output control information depending on the surface contour information; and the energy output unit outputs, depending on the output control information, to the encapsulant at the to-be-heated location energy in a distribution corresponding to a surface contour shape of the encapsulant.

Optionally, the energy output unit is a light source or a heat source.

Preferably, the energy output unit is a laser.

Optionally, the thickness detection unit is a non-contact type optical film thickness measuring instrument.

Optionally, the component to be encapsulated is a glass component, and the encapsulant is frit.

To achieve the above-mentioned goal, the present disclosure further provides an encapsulation method, the encapsulation method being based on an encapsulation system comprising a thickness detection unit, an output control unit and an energy output unit, the thickness detection unit being connected with the output control unit, and the output control unit being connected with the energy output unit.

The encapsulation method comprises:

detecting by the thickness detection unit a thickness of an encapsulant at a to-be-heated location in the component to be encapsulated and generating corresponding thickness information;

generating by the output control unit corresponding output control information depending on the thickness information; and outputting by the energy output unit, depending on the output control information, to the encapsulant at the to-be-heated location energy for heating and melting the encapsulant so as to seal the component to be encapsulated.

Optionally, the encapsulation system further comprises a location detection unit and an adjustment unit, the location detection unit being connected with the adjustment unit, and the adjustment unit being connected with both the thickness detection unit and the energy output unit, wherein:

prior to the step of detecting by the thickness detection unit the thickness of the encapsulant at the to-be-heated location in the component to be encapsulated and generating corresponding thickness information, the following steps are further included:

detecting by the location detection unit an actual location of the encapsulant at the to-be-heated location in the component to be encapsulated and generating corresponding location information; and adjusting by the adjustment unit, depending on the location information, a detection location of the thickness detection unit and an energy output location of the energy output unit.

Optionally, the output control information comprises first output information and second output information, and the output control unit comprises a groove judgment module, a depth judgment module and a first output control module, the groove judgment module being connected with the thickness detection unit, the depth judgment module and the first output control module, the depth judgment module being connected with the first output control module, and the first output control module being connected with the energy output unit, wherein:

the step of generating by the output control unit corresponding output control information depending on the thickness information comprises:

judging by the groove judgment module whether a groove is existent in a surface of the encapsulant depending on the thickness information; if the groove is judged to be existent in the surface of the encapsulant, executing a step of judging by the depth judgment module whether a depth of the groove is greater than a predetermined value, and if the groove is judged to be non-existent in the surface of the encapsulant, transmitting by the first output control module the second output information to the energy output unit; and judging by the depth judgment module whether a depth of the groove is greater than a predetermined value; if the depth of the groove is judged to be greater than the predetermined value, transmitting by the first output control module the first output information to the energy output unit, and if the depth of the groove is judged to be smaller than or equal to the predetermined value, transmitting by the first output control module the second output information to the energy output unit.

Optionally, the step of outputting by the energy output unit, depending on the output control information, to the encapsulant at the to-be-heated location energy for heating the encapsulant comprises:

outputting by the energy output unit to the encapsulant at the to-be-heated location preset energy in a hump-shape distribution depending on the first output information; or outputting by the energy output unit to the encapsulant at the to-be-heated location preset energy in a Gaussian distribution depending on the second output information.

Alternatively, the output control unit comprises a contour generation module and a second output control module, the contour generation module being connected with both the thickness detection unit and the second output control module, and the second output control module being connected with the energy output unit, wherein:

the step of generating by the output control unit corresponding output control information depending on the thickness information comprises:

generating by the contour generation module, depending on the thickness information, surface contour information of the encapsulant at the to-be-heated location; and generating by the second output control module the output control information depending on the surface contour information.

Optionally, the step of outputting by the energy output unit, depending on the output control information, to the encapsulant at the to-be-heated location energy for heating the encapsulant comprises:

outputting by the energy output unit to the encapsulant at the to-be-heated location energy in a distribution corresponding to a surface contour shape of the encapsulant depending on the output control information.

Optionally, the energy output unit is a light source or a heat source.

Preferably, the energy output unit is a laser.

Optionally, the thickness detection unit is a non-contact type optical film thickness measuring instrument.

Optionally, the component to be encapsulated is a glass component, and the encapsulant is frit.

The present disclosure has the following beneficial effects.

The present disclosure provides an encapsulation system and an encapsulation method, the encapsulation system comprising a thickness detection unit, an output control unit and an energy output unit. By acquiring by the thickness detection unit thickness information of the frit at the to-be-heated location, generating by the output control unit corresponding output control information depending on the thickness information, and outputting by the energy output unit, depending on the output control information, to the fit at the to-be-heated location energy for heating the frit, the present disclosure achieves proper heating of the frit based on its actual state such that all the frit at the to-be-heated location can sufficiently melt, which effectively improves the sealing of the product.

DETAILED DESCRIPTION

In order for those skilled in the art to have a better understanding of the technical solution of the present disclosure, the encapsulation system and encapsulation method provided by the present disclosure will be described in detail below with reference to the accompanying figures.

Embodiment I

Figure 1:
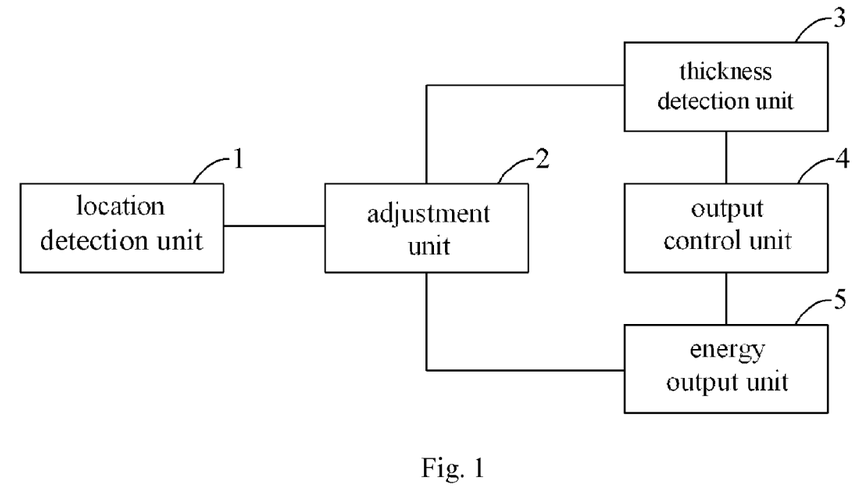
FIG. 1 is a schematic view of a structure of an encapsulation system provided in embodiment I of the present disclosure.

FIG. 1 is a schematic view of a structure of an encapsulation system provided in embodiment I of the present disclosure. As shown in FIG. 1, the encapsulation system comprises a thickness detection unit 3, an output control unit 4 and an energy output unit 5, the thickness detection unit 3 being connected with the output control unit 4, and the output control unit 4 being connected with the energy output unit 5. Therein, the thickness detection unit 3 is configured to detect a thickness of an encapsulant at a to-be-heated location in a component to be encapsulated, and generate corresponding thickness information. The output control unit 4 is configured to generate corresponding output control information depending on the thickness information. The energy output unit 5 is configured to output, depending on the output control information, to the encapsulant at the to-be-heated location energy for heating and melting the encapsulant so as to seal the component to be encapsulated. Therein, the component to be encapsulated is a component that requires a sealing treatment. It may be but not limited to a glass component, which glass component is formed by cell-aligning a first substrate (comprising thin film transistors and an electrodes) with a second substrate; the encapsulant is a material that can melt when heated and thereby can seal the component to be encapsulated, the encapsulant being disposed between the first substrate and the second substrate to form a closed path, wherein the area enclosed by the closed path is namely the area to be sealed, and the encapsulant may be but not limited to frit. In this embodiment, explanations are given by taking as an example the case in which the component to be encapsulated is a glass component and the encapsulant is frit.

By acquiring by the thickness detection unit 3 thickness information of the frit at the to-be-heated location, generating by the output control unit 4 corresponding output control information, and outputting by the energy output unit 5, depending on the output control information, to the fit at the to-be-heated location energy for heating the frit, the technical solution of the present disclosure achieves proper heating of the frit based on its actual state such that all the frit at the to-be-heated location can sufficiently melt, which effectively improves the sealing of the product.

It is to be noted that in the embodiment the thickness detection unit 3 can specifically be a non-contact type optical film thickness measuring instrument, which film thickness measuring instrument is a common measuring instrument in the art, the structure and operation principle of which will not be discussed here for simplicity.

The energy output unit 3 can specifically be a light source or a heat source. Preferably, the energy output unit 5 is a light source, and specifically the energy output unit 5 is a laser capable of emitting laser beams. Since the optical beams generated by the light source serving as the energy output unit 5 have good directionality, the output direction and intensity distribution of energy can be accurately controlled by adjusting the light source. In this embodiment, explanations are given by taking as an example the case in which the energy output unit 5 is a laser which forms on the surface of the frit to be heated a light spot for heating the frit.

In addition, the specific structure of the output control unit 4 will be described below in detail.

In this embodiment, to solve the problem that the frit in a deviation location cannot be heated and melted due to the deviation of location of the frit when it is coated, the encapsulation system optionally further comprises a location detection unit 1 and an adjustment unit 2, the location detection unit 1 being connected with the adjustment unit 2, and the adjustment unit 2 being connected with both the thickness detection unit 3 and the energy output unit 5, wherein the location detection unit 1 is configured to detect an actual location of the frit at the to-be-heated location in the glass component and generate corresponding location information, and the adjustment unit 2 is configured to adjust, depending on the location information, a detection location of the thickness detection unit 3 and an energy output location of the energy output unit 5. In the present disclosure, by means of the location detection unit 1, the actual location of the frit at the to-be-heated location can be effectively detected, and by means of the adjustment unit 2, the detection location of the thickness detection unit 3 can be adjusted to the actual location of the frit at the to-be-heated location and the energy output location of the energy output unit 5 to the actual location of the fit to be heated. Therefore, even if part of the fit is located in a deviation location, in the subsequent processing procedure, the frit located in the deviation location can still be detected by the thickness detection unit 3 and heated by the energy output unit 5, such that all the frit at the to-be-heated location can completely melt during the heating, which effectively improves the sealing of the product. It is to be noted that the location detection unit 1 in the embodiment may specifically be any measuring instrument for detecting location in the prior art of the field, which will not be discussed here for simplicity.

The structure and operation principle of the output control unit 4 in this embodiment will be described below in detail with reference to the accompanying figures.

Figure 2:
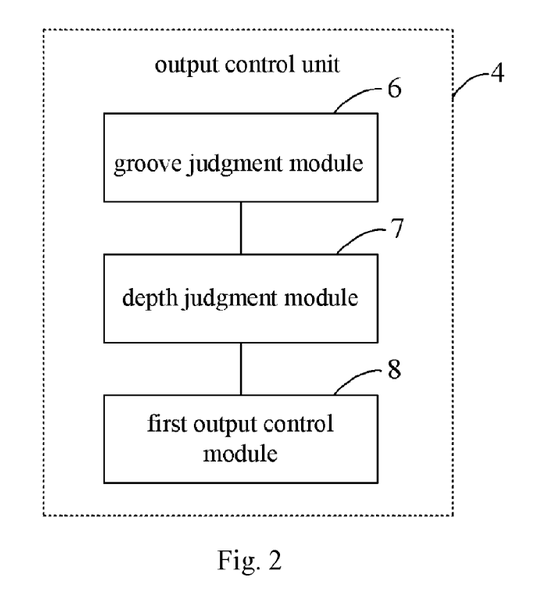
FIG. 2 is a schematic view of a structure of the output control unit in FIG. 1.

FIG. 2 is a schematic view of a structure of the output control unit in FIG. 1. As shown in FIG. 2, the output control unit 4 comprises a groove judgment module 6, a depth judgment module 7 and a first output control module 8, the groove judgment module 6 being connected with the thickness detection unit 3, the depth judgment module 7 and the first output control module 8, the depth judgment module 7 being connected with the first output control module 8, and the first output control module 8 being connected with the energy output unit 5. Therein, the groove judgment module 6 is configured to judge whether a groove is existent in a surface of the frit depending on the thickness information. If the groove is judged to be nonexistent in the surface of the frit, the first output control module 8 transmits the second output information to the energy output unit 5. If the groove is judged to be existent in the surface of the frit, the depth judgment module 7 further judges whether a depth of the groove is greater than a predetermined value. Specifically, if the depth judgment module 7 judges that the depth of the groove is greater than the predetermined value, the first output control module 8 transmits the first output information to the energy output unit 5, and if the depth of the groove is judged to be smaller than or equal to the predetermined value, the first output control module 8 transmits the second output information to the energy output unit 5.

Figure 6:
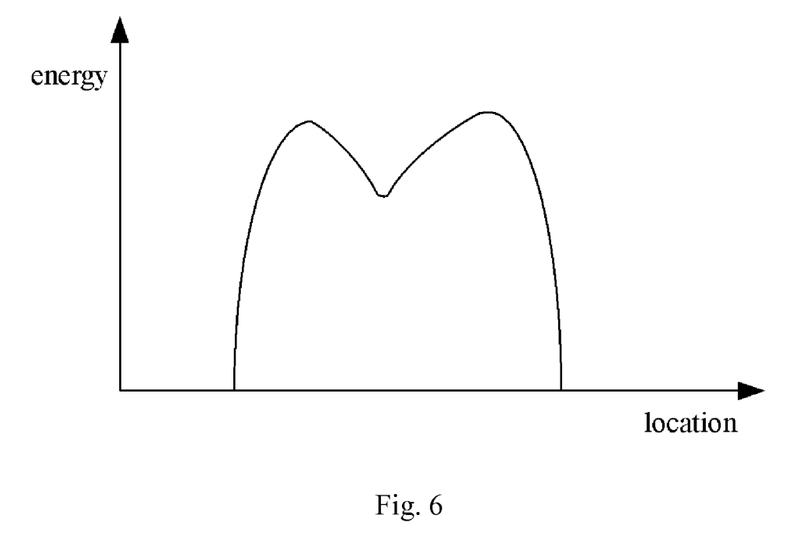
FIG. 6 is a schematic view of a distribution of energy outputted by the energy output unit to the fit corresponding to the contour diagram as shown in FIG. 5.

The energy output unit 5 outputs to the fit at the to-be-heated location preset energy in a hump-shape distribution depending on the first output information (as shown in the drawing of FIG. 6); the energy output unit 5 outputs to the frit at the to-be-heated location preset energy in a Gaussian distribution depending on the second output information. Therein, the first output information and the second output information are both output control information transmitted to the energy output unit 5.

Figure 3:
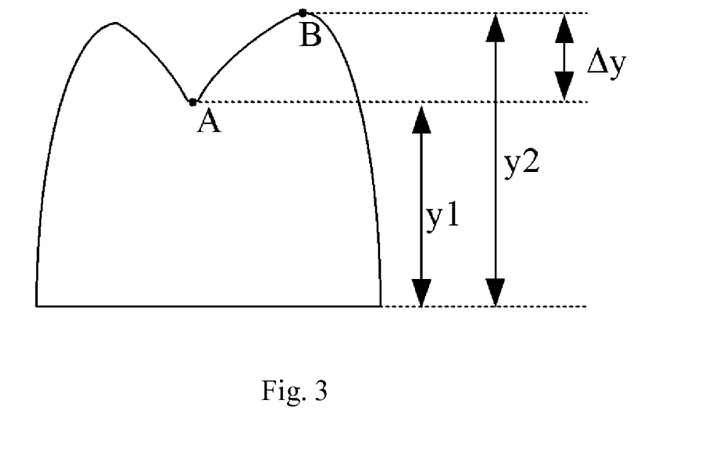
FIG. 3 shows a corresponding longitudinal cross-section diagram of the fit when a groove is existent in the surface of the frit.

Therein, the principle of judging by the groove judgment module 6 whether a groove is existent in the surface of the frit is roughly as follows: firstly, a longitudinal cross-section diagram of the frit at the to-be-heated location is generated depending on the thickness information, and then, it can be clearly judged whether a groove is existent or not in the surface of the frit based on the longitudinal cross-section diagram. FIG. 3 shows a corresponding longitudinal cross-section diagram of the frit when a groove is existent in the surface of the frit. As shown in FIG. 3, the longitudinal cross-section diagram has a strict minimum point A, and in this case a groove can be judged to be existent in the surface of the frit. A depth of the groove is then derived by calculating a step $\Delta y = y_2 - y_1$ between the strict minimum point A (corresponding to the bottom end of the groove) and an adjacent strict maximum point B which is greater (corresponding to the top end of the groove), the depth of the groove equaling the step $\Delta y$, where y1 is a thickness of the frit at the strict minimum point A, and y2 is a thickness of the frit at the strict maximum point B.

In the prior art, the frit is heated using energy in a Gaussian distribution no matter in what kind of state the thickness of the frit at the to-be-heated location is, i.e., no matter whether a groove is existent in the surface of the frit at the to-be-heated location. When a groove with a large depth (the step is great) is existent in the surface of the frit at the to-be-heated location, the melting speed in a central area of the groove will be much higher than that in a marginal area of the groove, and in this case the groove will "sink", which gives rise to bubbles in the frit.

Directed at the above technical problem, the present disclosure arranges two optical paths with different energy distributions correspondingly in the energy output unit 5 upon the actual situation of the thickness of the frit at the to-be-heated location. When a groove is existent in the surface of the frit and the depth of the groove is large (the depth is greater than the predetermined value), the first output control module 8 transmits the first output information to the energy output unit 5 which outputs to the frit at the to-be-heated location preset energy in a hump-shape distribution depending on the first output information (energy in any transversal passing through a center of the light spot on the surface of the frit is in a hump-shape distribution). When a groove is non-existent in the surface of the frit or it is existent with a small depth (the depth is smaller than or equal to the predetermined value), the first output control module 8 transmits the second output information to the energy output unit 5 which outputs to the frit at the to-be-heated location preset energy in a Gaussian distribution depending on the second output information (energy in any transversal passing through a center of the light spot on the surface of the frit is in a Gaussian distribution).

It is to be noted that the method for judging whether a groove is existent in the surface of the frit and for acquiring a depth of the groove (if any) in this embodiment is not limited to the above method. Any method for judging whether a groove is existent in a surface of an object and for acquiring a depth of the groove (if any) in the prior art can be adopted in this embodiment.

Figure 4:
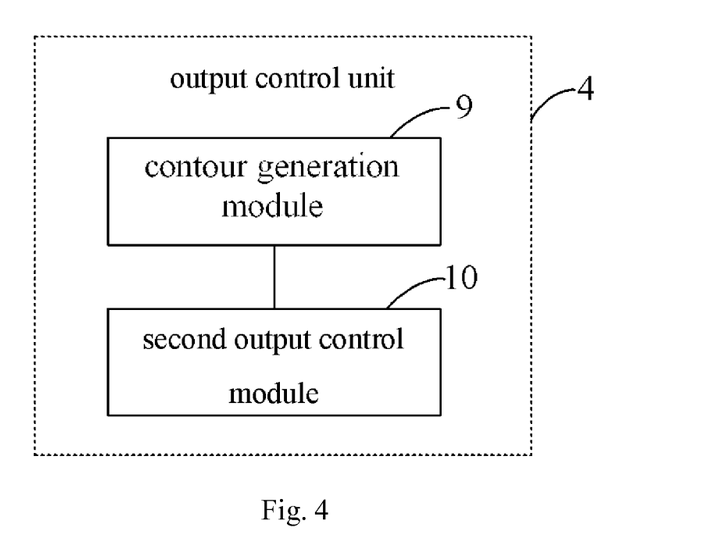
FIG. 4 is a schematic view of a further structure of the output control unit in FIG. 1.

FIG. 4 is a schematic view of a further structure of the output control unit in FIG. 1. As shown in FIG. 4, as a further alternative solution of this embodiment, the output control unit 4 comprises a contour generation module 9 and a second output control module 10, the contour generation module 9 being connected with both the thickness detection unit 3 and the second output control module 10, and the second output control module 10 being connected with the energy output unit 5. The contour generation module 9 is configured to generate surface contour information of the frit at the to-be-heated location depending on the thickness information. The second output control module 10 is configured to generate output control information depending on the surface contour information. The energy output unit 5 outputs to the frit at the to-be-heated location energy in a distribution corresponding to a surface contour shape of the frit depending on the output control information.

The operation principle of the contour generation module 9 and the second output control module 10 as shown in FIG. 4 will be described below in detail with reference to FIGS. 5 and 6.

Figure 5:
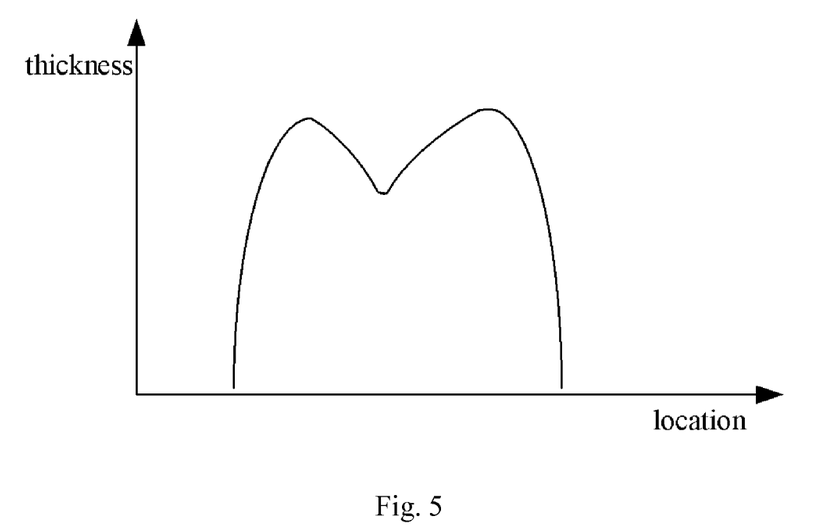
FIG. 5 shows a contour diagram of a longitudinal cross-section of the frit at a to-be-heated location.

FIG. 5 shows a contour diagram of a longitudinal cross-section of the frit at the to-be-heated location. FIG. 6 is a schematic view of a distribution of energy outputted by the energy output unit to the frit corresponding to the contour diagram as shown in FIG. 5. As shown in FIGS. 5 and 6, in FIG. 5, the lateral axis represents a location and the longitudinal axis represents a thickness of the frit in the corresponding location; in FIG. 6, the lateral axis represents a location and the longitudinal axis represents energy outputted by the energy output unit 5 to a surface of the frit in the corresponding location. As can be seen from FIGS. 5 and 6, in a location where the thickness of the frit is relatively larger, the energy outputted by the energy output unit 5 is relatively stronger; in a location where the thickness of the frit is relatively smaller, the energy outputted by the energy output unit 5 is relatively weaker. Based on the above principle, the energy output unit 5 can be enabled to output to the frit at the to-be-heated location energy in a distribution corresponding to the surface contour shape of the frit depending on the output control information such that all the frit at the to-be-heated location can sufficiently melt, which effectively improves the sealing of the product.

To sum up, the encapsulation system provided in embodiment I of the present disclosure can properly heat the frit based on its actual state such that the frit at the to-be-heated location can all sufficiently melt, which effectively improves the sealing of the product.

Embodiment II

Figure 7:
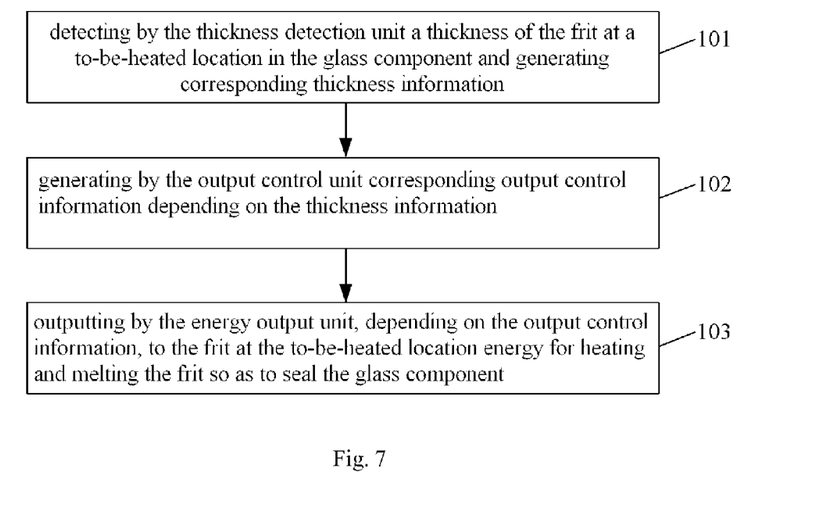
FIG. 7 is a flow diagram of an encapsulation method provided in embodiment II of the present disclosure.

FIG. 7 is a flow diagram of an encapsulation method provided in embodiment II of the present disclosure. As shown in FIG. 7, the encapsulation method is based on an encapsulation system comprising a thickness detection unit, an output control unit and an energy output unit, the thickness detection unit being connected with the output control unit, and the output control unit being connected with the energy output unit. In this embodiment, explanations are given by taking as an example the case in which the component to be encapsulated is a glass component and the encapsulant is frit; however it is to be noted that the component to be encapsulated is not limited to the glass component, and the encapsulant is not limited to the frit.

The encapsulation method comprises the following steps.

Step 101: detecting by the thickness detection unit a thickness of the frit at a to-be-heated location in the glass component and generating corresponding thickness information.

At step 101, the thickness detection unit can specifically be a non-contact type optical film thickness measuring instrument, which film thickness measuring instrument is a common measuring instrument in the art, the structure and operation principle of which will not be discussed here in detail.

Step 102: generating by the output control unit corresponding output control information depending on the thickness information.

In this embodiment, optionally, the output control information comprises first output information and second output information, and the output control unit comprises a groove judgment module, a depth judgment module and a first output control module, the groove judgment module being connected with the thickness detection unit, the depth judgment module and the first output control module, the depth judgment module being connected with the first output control module, and the first output control module being connected with the energy output unit.

Figure 8:
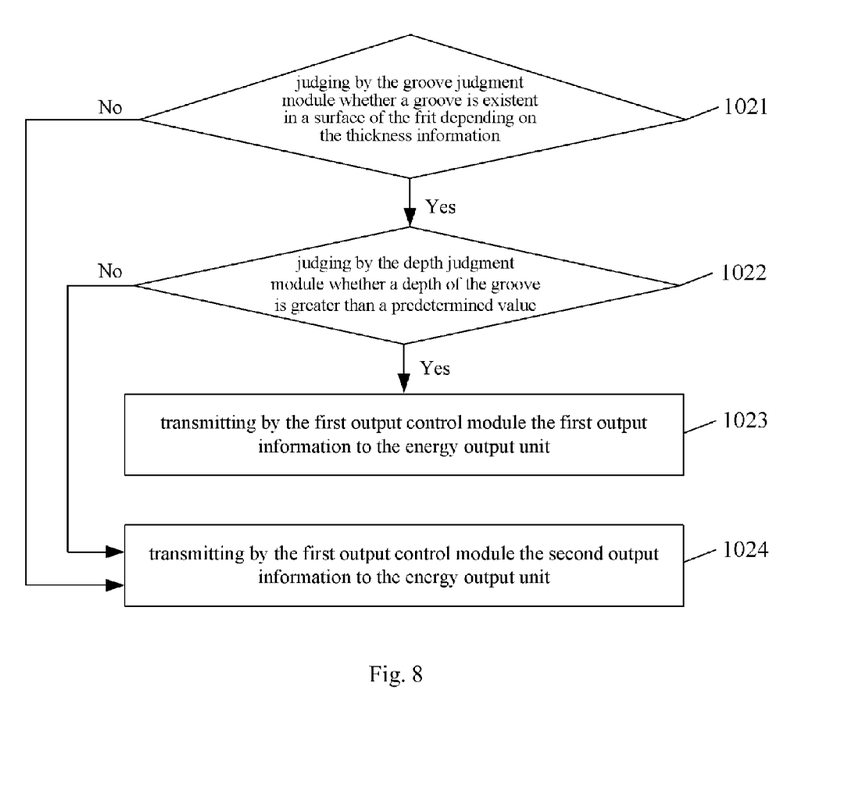
FIG. 8 is an internal flow diagram of step 102 in FIG. 7.

FIG. 8 is an internal flow diagram of step 102 in FIG. 7. As shown in FIG. 8, in this case, step 102 specifically comprises the following steps.

Step 1021: judging by the groove judgment module whether a groove is existent in a surface of the frit depending on the thickness information.

At step 1021, if the groove is judged to be existent in the surface of the frit, step 1022 will be executed; if the groove is judged to be non-existent in the surface of the frit, step 1024 will be executed.

It is to be noted that the description in the above embodiment I can be referred to for the procedure of judging by the groove judgment module whether the groove is existent in the surface of the frit, which will not be discussed here for simplicity.

Step 1022: judging by the depth judgment module whether a depth of the groove is greater than a predetermined value.

At step 1022, if the depth of the groove is judged to be greater than the predetermined value, step 1023 will be executed; if the depth of the groove is judged to be smaller than or equal to the predetermined value, step 1024 will be executed.

Step 1023: transmitting by the first output control module first output information to the energy output unit.

After step 1023 has been executed, step 103 is executed sequentially.

Step 1024: transmitting by the first output control module second output information to the energy output unit.

After step 1024 has been executed, step 103 is executed sequentially.

Or alternatively, the output control unit comprises a contour generation module and a second output control module, the contour generation module being connected with both the thickness detection unit and the second output control module, and the second output control module being connected with the energy output unit.

In this case, step 102 specifically comprises the following steps (not shown).

Step 1025: generating by the contour generation module, depending on the thickness information, surface contour information of the frit at the to-be-heated location.

Step 1026: generating by the second output control module output control information depending on the surface contour information.

After step 1026 has been executed, step 103 is executed sequentially.

Step 103: outputting by the energy output unit, depending on the output control information, to the frit at the to-be-heated location energy for heating and melting the frit so as to seal the glass component.

At step 103, the energy output unit can specifically be a light source or a heat source.

If the output control unit comprises the groove judgment module, the depth judgment module and the first output control module, when the energy output unit receives the first output information, it outputs to the frit at the to-be-heated location preset energy in a hump-shape distribution depending on the first output information; when the energy output unit receives the second output information, it outputs to the frit at the to-be-heated location preset energy in a Gaussian distribution depending on the second output information. The description in the above embodiment I can be referred to for this procedure, which will not be discussed here for simplicity.

If the output control unit comprises the contour generation module and the second output control module, the energy output unit outputs to the frit at the to-be-heated location energy in a distribution corresponding to a surface contour shape of the fit depending on the output control information. The description in the above embodiment I can be referred to for this procedure, which will not be discussed here for simplicity.

It is to be noted that, in case the output control unit comprises the groove judgment module, the depth judgment module and the first output control module, the energy output unit can only output preset energy in a hump-shape distribution and in a Gaussian distribution, i.e., the energy output of the energy output unit has been preset; in case the output control unit comprises the contour generation module and the second output control module, the energy output unit can output energy in a distribution corresponding to a surface contour shape of the fit, i.e., the energy output of the energy output unit can be dynamically adjusted according to the surface contour shape of the frit such that the heating of the frit is more even and more sufficient.

To sum up, the encapsulation method provided in embodiment II of the present disclosure can properly heat the frit based on its actual state such that the frit at the to-be-heated location can all sufficiently melt, which effectively improves the sealing of the product.

Embodiment III

Figure 9:
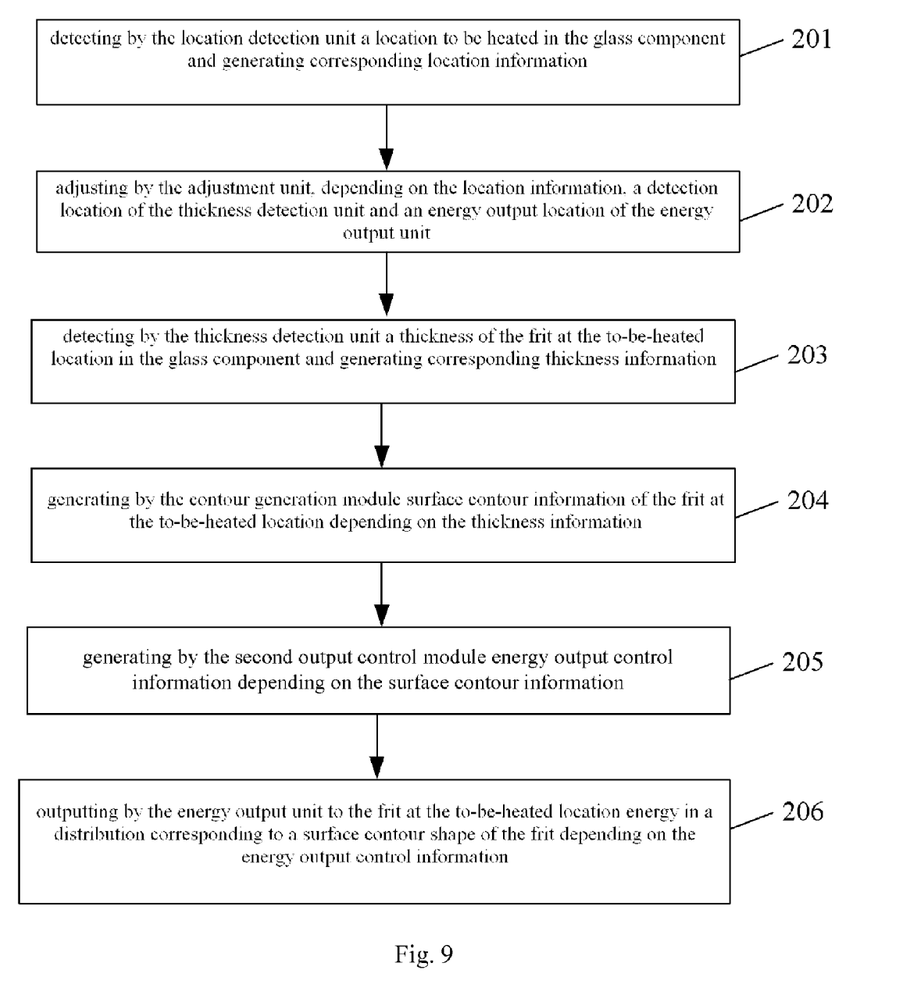
FIG. 9 is a flow diagram of an encapsulation method provided in embodiment III of the present disclosure.

FIG. 9 is a flow diagram of an encapsulation method provided in embodiment III of the present disclosure. As shown in FIG. 9, the encapsulation method is based on an encapsulation system comprising a location detection unit, an adjustment unit, a thickness detection unit, an output control unit and an energy output unit, the output control unit comprising a contour generation module and a second output control module, the location detection unit being connected with the adjustment unit, the adjustment unit being connected with both the thickness detection unit and the energy output unit, the thickness detection unit being connected with the contour generation module in the output control unit, the contour generation module in the output control unit being connected with the second output control module, the second output control module in the output control unit being connected with the energy output unit. In this embodiment, explanations are given by taking as an example the case in which the component to be encapsulated is a glass component and the encapsulant is frit; however it is to be noted that the component to be encapsulated is not limited to the glass component, and the encapsulant is not limited to the frit.

The encapsulation method comprises the following steps.

Step 201: detecting by the location detection unit an actual location of the frit at a to-be-heated location in the glass component and generating corresponding location information.

At step 201, the actual location of the frit at the to-be-heated location can be effectively detected by means of the location detection unit.

Step 202: adjusting by the adjustment unit, depending on the location information, a detection location of the thickness detection unit and an energy output location of the energy output unit.

At step 202, the adjustment unit adjusts, depending on the location information, the detection location of the thickness detection unit and the energy output location of the energy output unit, such that when part of the fit is located in a deviation location, the frit located in the deviation location can still be detected by the thickness detection unit and heated by the energy output unit in the subsequent processing procedure. Consequently, the frit at the to-be-heated location can all completely melt during the heating, which effectively improves the sealing of the product.

Step 203: detecting by the thickness detection unit a thickness of the frit at the to-be-heated location in the glass component and generating corresponding thickness information.

Step 204: generating by the contour generation module, depending on the thickness information, surface contour information of the frit at the to-be-heated location.

Step 205: generating by the second output control module output control information depending on the surface contour information.

The description in the above embodiment I can be referred to for the operation principle of the contour generation module and the second output control module, which will not be discussed here for simplicity.

Step 206: outputting by the energy output unit to the frit at the to-be-heated location energy in a distribution corresponding to a surface contour shape of the frit depending on the output control information.

At step 206, the energy output unit outputs to the frit at the to-be-heated location energy in a distribution corresponding to the surface contour shape of the frit depending on the output control information, such that the frit at the to-be-heated location can all sufficiently melt, which effectively improves the sealing of the product.

To sum up, the encapsulation method provided in embodiment III of the present disclosure can properly heat the frit based on its actual state such that the frit at the to-be-heated location can all sufficiently melt, which effectively improves the sealing of the product.

It is to be understood that the above embodiments are only exemplary embodiments for illustration of the principles of the present disclosure; however the present disclosure is not limited thereto. Various variations and modifications can be made by an ordinary person skilled in the art without departing from the spirit and the essence of the present disclosure, and such variations and modifications are also deemed as falling within the protection scope of the present disclosure.

What is claimed is:

1. An encapsulation system comprising:
 a thickness detection unit, configured to detect a thickness of an encapsulant at a to-be-heated location in a component to be encapsulated, and generate corresponding thickness information;
 an output control unit connected with the thickness detection unit, configured to generate corresponding output control information depending on the thickness information; and
 an energy output unit connected with the output control unit, configured to output, depending on the output control information, to the encapsulant at the to-be-heated location, energy for heating and melting the encapsulant so as to seal the component to be encapsulated;
 wherein the output control unit comprises:
  a groove judgment module, connected with the thickness detection unit, configured to judge whether a groove is existent in a surface of the encapsulant depending on the thickness information;

a depth judgment module connected with the groove judgment module, the depth judgement module being configured to judge whether a death of the groove is greater than a predetermined value in response to a judgement of the groove judgment module that the groove is existent in the surface of the encapsulant; and a first output control module connected with the energy output unit, the groove judgment module and the depth judgment module, the first output control module being configured to transmit a first output information to the energy output unit in response to a judgement of the depth judgment module that the death of the groove is greater than the predetermined value, to transmit a second output information to the energy output unit in response to a judgement of the depth judgment module that the depth of the groove is not greater than the predetermined value, and to transmit the second output information to the energy output unit in response to a judgement of the groove judgment module that the groove is not existent in the surface of the encapsulant; and wherein the energy output unit is configured to output to the encapsulant, at the to-be-heated location, preset energy in a hump-shape distribution upon receipt of the first output information, and to output to the encapsulant at the to-be-heated location, preset energy in a Gaussian distribution upon receipt of the second output information.

2. The encapsulation system according to claim 1, further comprising:

a location detection unit, configured to detect an actual location of the encapsulant at the to-be-heated location in the component to be encapsulated and generate corresponding location information; and an adjustment unit connected with the location detection unit, the thickness detection unit and the energy output unit, configured to adjust, depending on the location information, a detection location of the thickness detection unit and an energy output location of the energy output unit.

3. The encapsulation system according to claim 1, wherein the output control unit comprises:

a contour generation module connected with the thickness detection unit, configured to generate surface contour information of the encapsulant at the to-be-heated location depending on the thickness information; and a second output control module connected with both the energy output unit and the contour generation module, configured to generate the output control information depending on the surface contour information; and wherein the energy output unit outputs to the encapsulant at the to-be-heated location energy in a distribution corresponding to a surface contour shape of the encapsulant depending on the output control information.

4. The encapsulation system according to claim 1, wherein the energy output unit is selected from the group consisting of a light source and a heat source.

5. The encapsulation system according to claim 4, wherein the energy output unit is a laser.

6. The encapsulation system according to claim 1, wherein the thickness detection unit is a non-contact type optical film thickness measuring instrument.

7. The encapsulation system according to claim 1, wherein the component to be encapsulated is a glass component, and the encapsulant is frit.

8. An encapsulation method based on an encapsulation system comprising a thickness detection unit, an output control unit and an energy output unit, the thickness detection unit being connected with the output control unit, and the output control unit being connected with the energy output unit, the encapsulation method comprising:

detecting by the thickness detection unit a thickness of an encapsulant at a to-be-heated location in a component to be encapsulated;

generating by the thickness detection unit thickness information corresponding to the thickness of the encapsulant at the to-be-heated location;

generating by the output control unit output control information corresponding to the thickness information, comprising:

judging whether a groove is existent in a surface of the encapsulant depending on the thickness information;

judging whether a depth of the groove is greater than a redetermined value in response to a judgement that the groove is existent in the surface of the encapsulant; and transmitting a first output information to the energy output unit in response to a judgement that the death of the groove is greater than the predetermined value, transmitting a second output information to the energy output unit in response to a judgement that the death of the groove is not greater than the redetermined value, and transmitting the second output information to the energy output unit in response to a judgement that the groove is not existent in the surface of the encapsulant; and outputting by the energy output unit, depending on the output control information, to the encapsulant at the to-be-heated location, energy for heating and melting the encapsulant so as to seal the component to be encapsulated, comprising:

outputting to the encapsulant at the to-be-heated location, preset energy in a hump-shape distribution upon receipt of the first output information; and outputting to the encapsulant at the to-be-heated location, preset energy in a Gaussian distribution upon receipt of the second output information.

9. The encapsulation method according to claim 8, wherein the encapsulation system further comprises a location detection unit and an adjustment unit, the location detection unit being connected with the adjustment unit, the adjustment unit being connected with both the thickness detection unit and the energy output unit, and wherein prior to the step of detecting by the thickness detection unit the thickness of the encapsulant at the to-be-heated location in the component to be encapsulated and generating corresponding thickness information, the encapsulation method further comprises:

detecting by the location detection unit an actual location of the encapsulant at the to-be-heated location in the component to be encapsulated and generating corresponding location information; and adjusting by the adjustment unit, depending on the location information, a detection location of the thickness detection unit and an energy output location of the energy output unit.

10. The encapsulation method according to claim 8, wherein the output control unit comprises a contour generation module and a second output control module, the contour generation module being connected with both the thickness detection unit and the second output control module, and the second output control module being connected with the energy output unit, and     wherein the step of generating by the output control unit output control information corresponding to the thickness information comprises:

generating by the contour generation module surface contour information of the encapsulant at the to-be-heated location depending on the thickness information; and         generating by the second output control module the output control information depending on the surface contour information.

11. The encapsulation method according to claim 10, wherein the step of outputting by the energy output unit, depending on the output control information, to the encapsulant at the to-be-heated location energy for heating the encapsulant comprises:

outputting by the energy output unit to the encapsulant at the to-be-heated location energy in a distribution corresponding to a surface contour shape of the encapsulant depending on the output control information.

12. The encapsulation method according to claim 8, wherein the energy output unit is selected from the group consisting of a light source and a heat source.

13. The encapsulation method according to claim 12, wherein the energy output unit is a laser.

14. The encapsulation method according to claim 8, wherein the thickness detection unit is a non-contact type optical film thickness measuring instrument.

15. The encapsulation method according to claim 8, wherein the component to be encapsulated is a glass component, and the encapsulant is frit.

\* \* \* \* \*